United States Patent
Iwata

(10) Patent No.: US 9,237,675 B2
(45) Date of Patent: Jan. 12, 2016

(54) COOLING UNIT, ELECTRONIC APPARATUS, AND GUIDE MEMBER

(71) Applicant: FUJITSU LIMITED, Kawasaki-shi, Kanagawa (JP)

(72) Inventor: Masaki Iwata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 233 days.

(21) Appl. No.: 13/929,254

(22) Filed: Jun. 27, 2013

(65) Prior Publication Data

US 2013/0286590 A1   Oct. 31, 2013

Related U.S. Application Data

(63) Continuation of application No. PCT/JP2010/073759, filed on Dec. 28, 2010.

(51) Int. Cl.
   *H05K 7/20* (2006.01)
   *G06F 1/20* (2006.01)

(52) U.S. Cl.
   CPC ............ *H05K 7/20136* (2013.01); *G06F 1/203* (2013.01)

(58) Field of Classification Search
   None
   See application file for complete search history.

(56) References Cited

U.S. PATENT DOCUMENTS

| | | | |
|---|---|---|---|
| 6,678,157 B1 * | 1/2004 | Bestwick | 361/695 |
| 7,256,993 B2 * | 8/2007 | Cravens et al. | 361/690 |
| 2005/0286222 A1 | 12/2005 | Lucero et al. | |
| 2007/0131383 A1 | 6/2007 | Hattori et al. | |
| 2007/0146988 A1 | 6/2007 | Yamagishi et al. | |
| 2008/0266796 A1 | 10/2008 | Iikubo | |
| 2010/0039772 A1 * | 2/2010 | Nitta et al. | 361/697 |
| 2010/0084123 A1 | 4/2010 | Shishido et al. | |
| 2010/0097764 A1 | 4/2010 | Ikubo | |
| 2010/0097964 A1 | 4/2010 | Astely et al. | |
| 2013/0027881 A1 * | 1/2013 | Goto et al. | 361/697 |
| 2015/0062805 A1 * | 3/2015 | Katsumata et al. | 361/679.49 |

FOREIGN PATENT DOCUMENTS

| | | |
|---|---|---|
| JP | 10247712 A | 9/1998 |
| JP | 2007-172328 A | 7/2007 |
| JP | 2007-189183 A | 7/2007 |
| JP | 2008-501200 A | 1/2008 |
| JP | 2008-140055 A | 6/2008 |
| JP | 2009-015870 A | 1/2009 |
| JP | 2009-064349 A | 3/2009 |
| JP | 2009-200144 A | 9/2009 |
| JP | 2010-161196 A | 7/2010 |

OTHER PUBLICATIONS

International Search Report for PCT/JP2010/073759, Mailing Date of Apr. 5, 2011.
Japenese Office action dated Jul. 29, 2014, issued in corresponding Japanese Application No. 2012-550637 w/English Translation (6 pages).

* cited by examiner

*Primary Examiner* — Courtney Smith
(74) *Attorney, Agent, or Firm* — Westerman, Hattori, Daniels & Adrian, LLP

(57) ABSTRACT

Cooling is performed efficiently by constituting: a fan which is provided with an outlet; a heatsink which is provided with an inlet with a larger size than that of the outlet of the fan in a height direction and through the interior of which an airflow generated by the fan passes; and a guide member which is disposed between the fan and the heatsink and which is configured to guide the airflow to an outer surface of the heatsink.

16 Claims, 13 Drawing Sheets

COOLING UNIT, ELECTRONIC APPARATUS, AND GUIDE MEMBER

CROSS-REFERENCE TO RELATED APPLICATION

This application is a continuation application of International Application PCT/JP2010/073759 filed on Dec. 28, 2010 and designated the U.S., the entire contents of which are incorporated herein by reference.

FIELD

The embodiment discussed herein is directed to a cooling unit, an electronic apparatus, and a guide member.

BACKGROUND

Cooling devices are known, which include: heat-dissipating fins that dissipate heat emitted from components; and a fan that cools down the heat-dissipating fins by blowing air onto them (for example, Patent Literature 1 listed below).

In general, such a cooling device employs a structure in which most of the airflow from the fan is directed to the heat-dissipating fins, in order to enhance the heat-dissipation effect of the heat-dissipating fins.

For electronic apparatuses, such as notebook personal computers, a slim device package is in demand. In an electronic apparatus of this type, the fan and the heat-dissipating fins are subjected to a stricter layout restriction than other mounted components are. For this reason, it is rare that a fan with a larger opening than the height of heat-dissipating fins is installed.

Accordingly, for electronic apparatuses, a configuration in which the airflow from the fan is directed between the heat-dissipating fins is employed.

[Patent Literature 1] Japanese Laid-open Patent Publication No. 2009-200144

By employing the configuration in which the airflow from the fan is directed between the heat-dissipating fins, the air from the fan is inhibited from flowing through part excluding the heat-dissipating fins. Therefore, this configuration may cause a disadvantage in that the heat tends to be retained within the gap between the heat-dissipating fins and the package, which is outside a space where the heat-dissipating fins are disposed.

SUMMARY

In order to attain the above objects, a cooling unit disclosed herein includes: a fan which is provided with an outlet; a heatsink which is provided with an inlet having a larger size than that of the outlet of the fan in a height direction and through the interior of which an airflow generated by the fan passes; and a guide member which is disposed between the fan and the heatsink and which is configured to guide the airflow to an outer surface of the heatsink.

An electronic apparatus disclosed herein includes: a package which houses the above cooling unit; and an electronic component which is disposed in the package and which is cooled down by the cooling unit.

A guide member disclosed herein is provided in a cooling unit including: a fan which is provided with an outlet; and a heatsink which is provided with an inlet having a larger size than that of the outlet of the fan in a height direction and through the interior of which an airflow generated by the fan passes. In addition, this guide member is configured to guide the airflow between the fan and the heatsink. The above guide member includes: an inclined surface which is formed with one end and another end. The one end is located at a front portion of the outlet of the fan in the height direction, and the other end deviates from the inlet of the heatsink in a direction along an outer surface of the heatsink. Moreover, the guide member is disposed between the fan and the heatsink, and guides the airflow to the outer surface of the heatsink.

A guide member disclosed herein is provided in a cooling unit including: a fan which is provided with an outlet; and a heatsink which is provided with an inlet having a larger size than that of the outlet of the fan in a height direction and through the interior of which an airflow generated by the fan passes. In addition, this guide member is configured to guide the airflow between the fan and the heatsink. The above guide member includes: an inclined surface which opposes the outlet of the fan and which is formed with one end and another end. The one end is located midway across the outlet of the fan in the height direction, and the other end is located opposite an end of the inlet of the heatsink in the direction along an outer surface of the heatsink. Moreover, the guide member is disposed between the fan and the heatsink, and guides the airflow to the outer surface of the heatsink.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, a description will be given of a notebook personal computer (notebook PC) that is an electronic apparatus as an example of an embodiment, with reference to the accompanying drawings.

Figure 1:
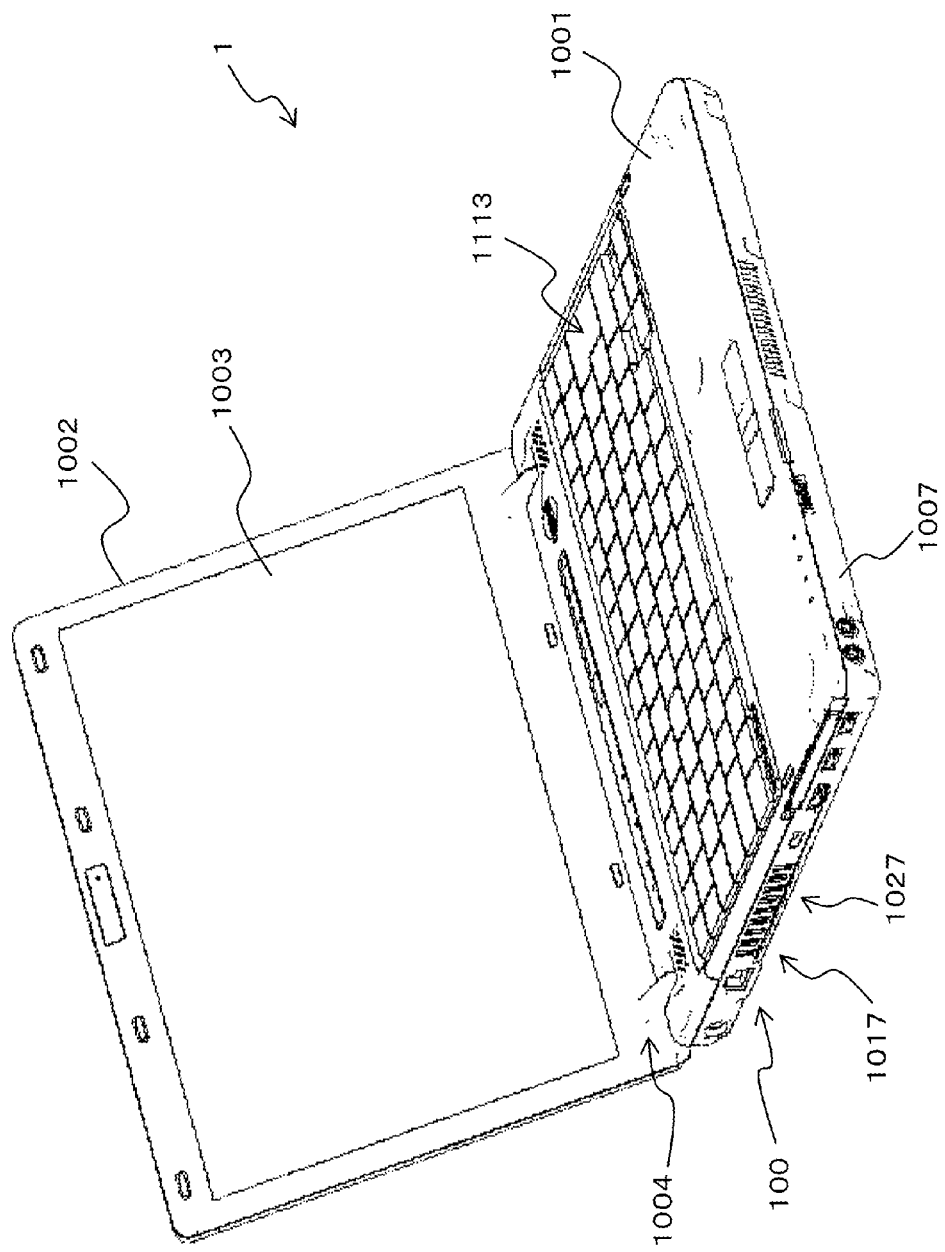
FIG. 1 is a perspective view illustrating an appearance of a notebook PC as an example of an embodiment.
Figure 2:
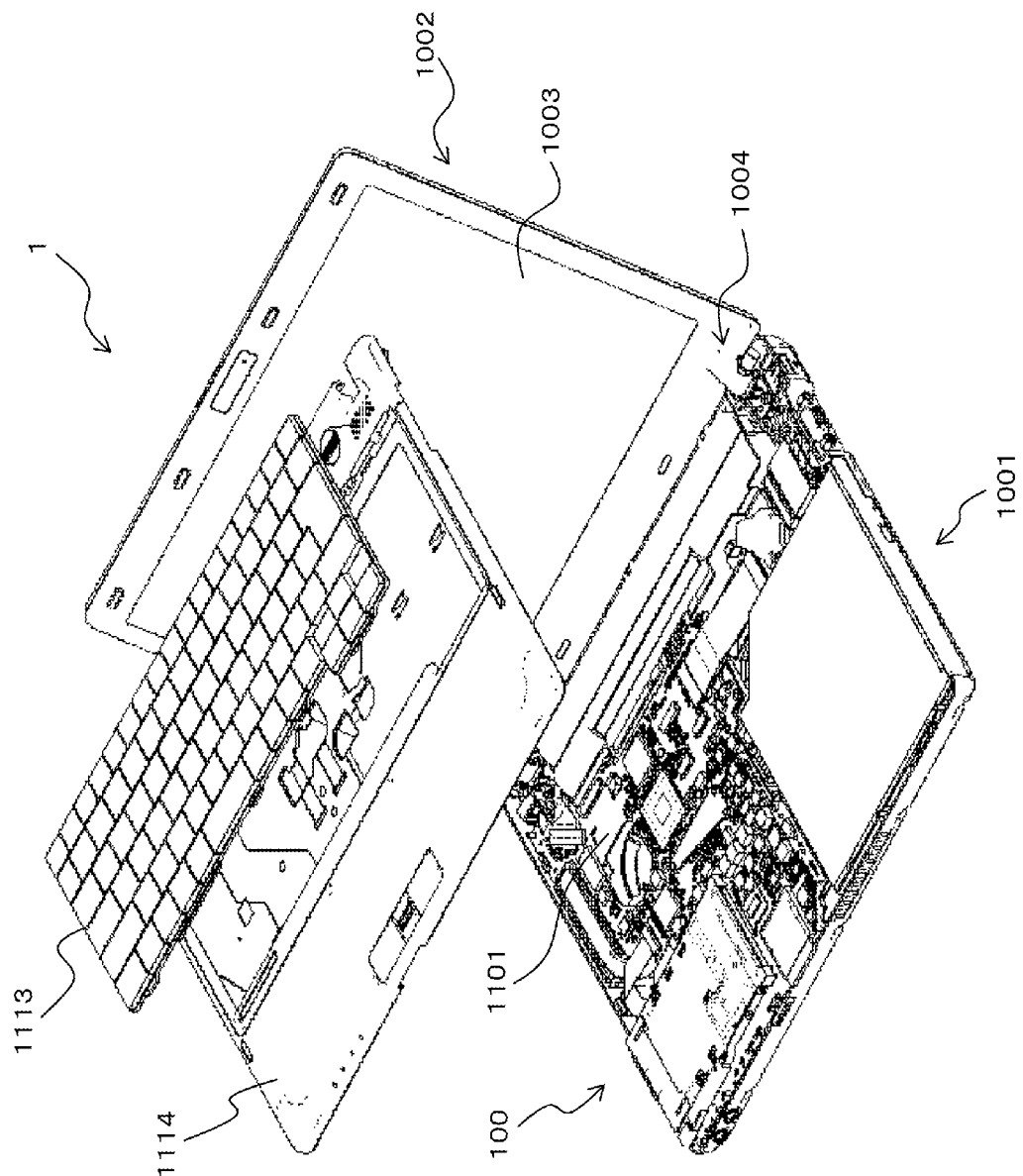
FIG. 2 is an exploded, perspective view of the notebook PC as an example of the embodiment.
Figure 3:
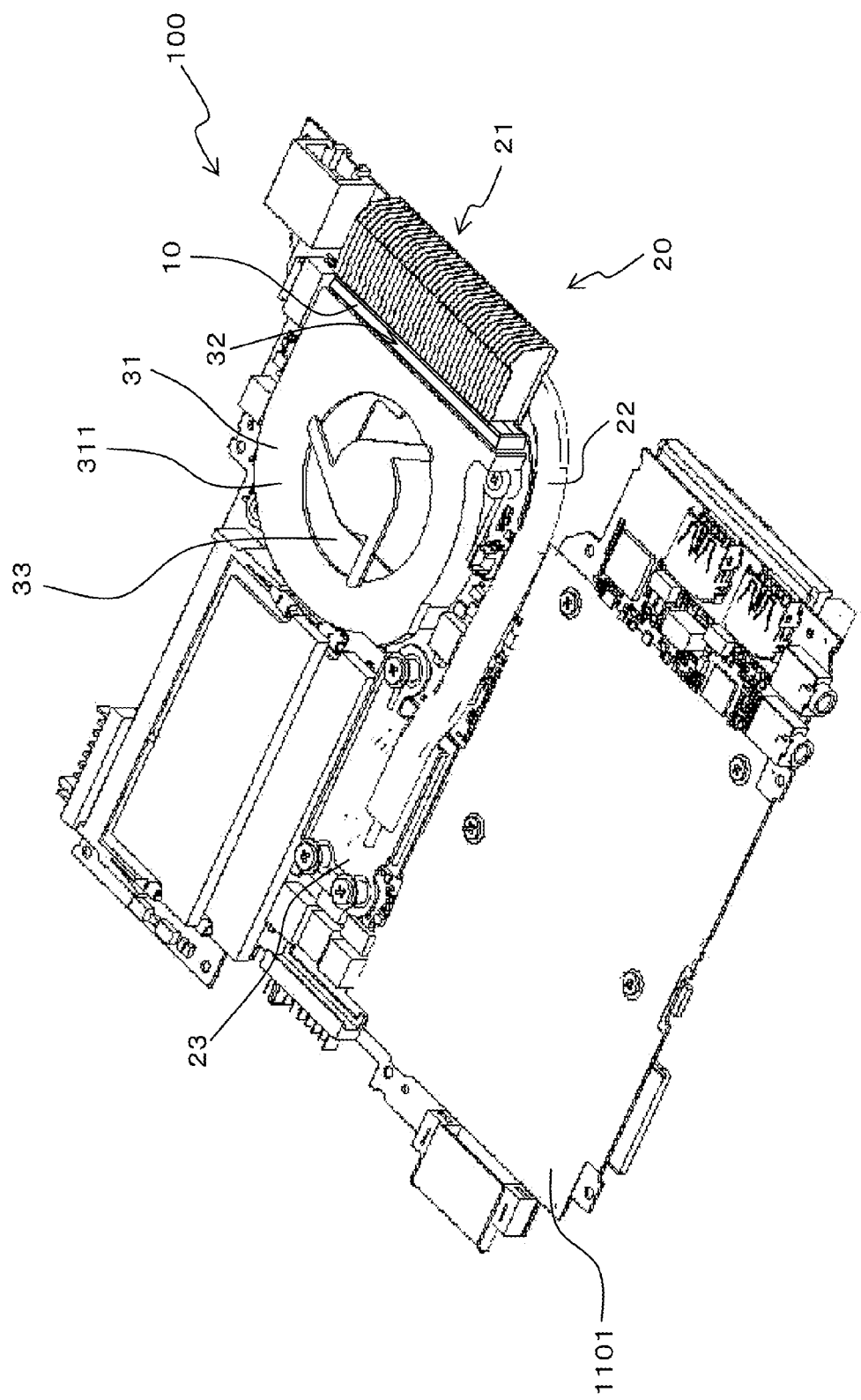
FIG. 3 is a perspective view illustrating an appearance of a mainboard unit on which a cooling unit is mounted, as an example of the embodiment.
Figure 4:
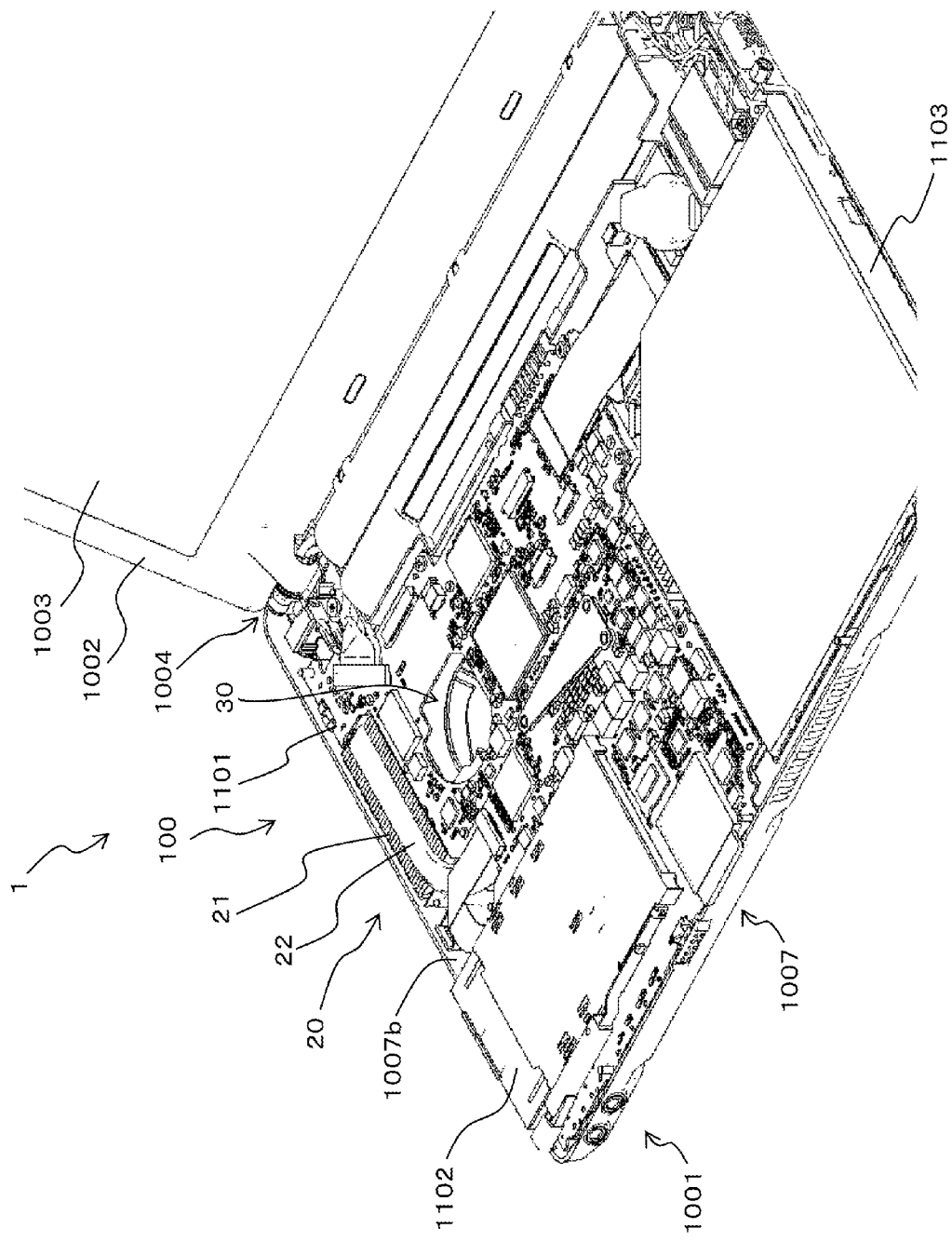
FIG. 4 is a perspective view illustrating an internal configuration of a first package in the notebook PC as an example of the embodiment.
Figure 5:
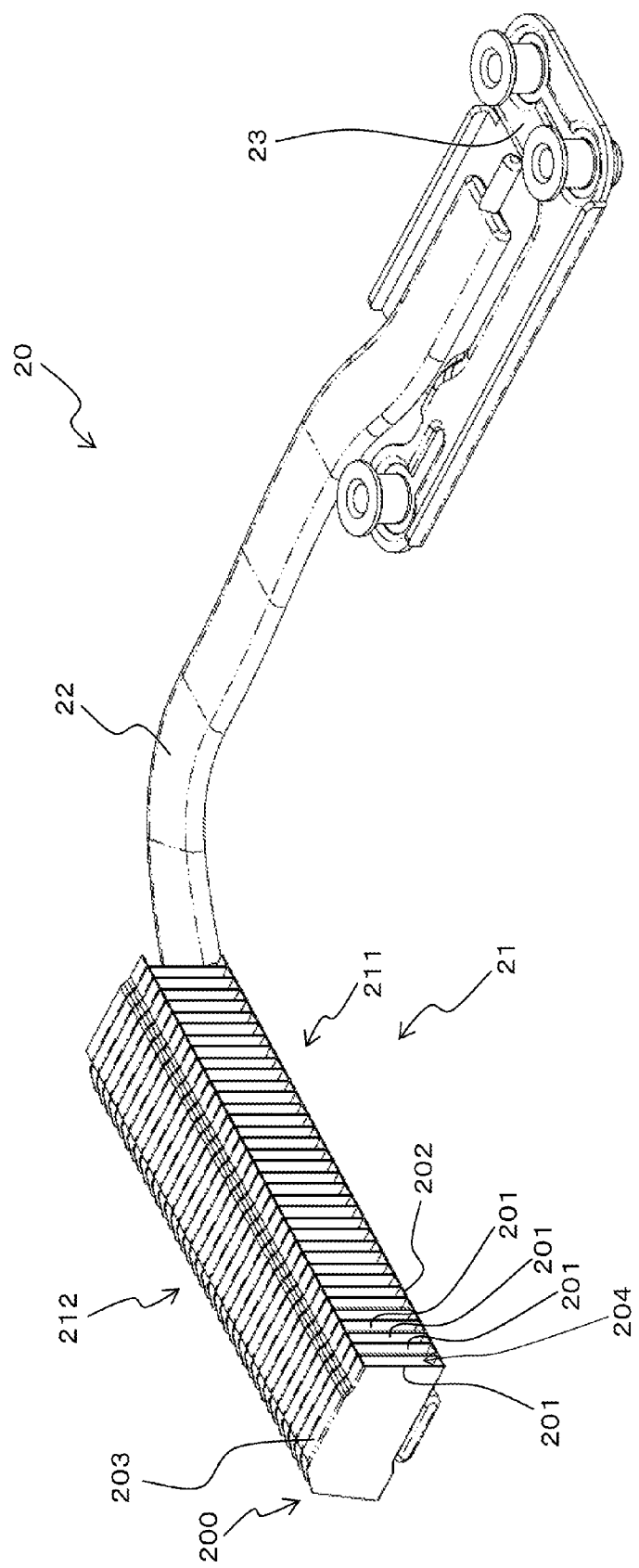
FIG. 5 is a perspective view illustrating a heat-dissipating member provided in the notebook PC as an example of the embodiment.

FIG. 1 is a perspective view illustrating an appearance of a notebook PC 1 as an example of the embodiment, and FIG. 2 is an exploded, perspective view of the notebook PC 1. FIG. 3 is a perspective view illustrating an appearance of a mainboard unit on which a cooling unit is mounted, as an example of the embodiment. FIG. 4 is a perspective view illustrating an internal configuration of a first package in the notebook PC 1 as an example of the embodiment, and FIG. 5 is a perspective view illustrating a heat-dissipating member 20 provided in the notebook PC 1.

Figure 6:
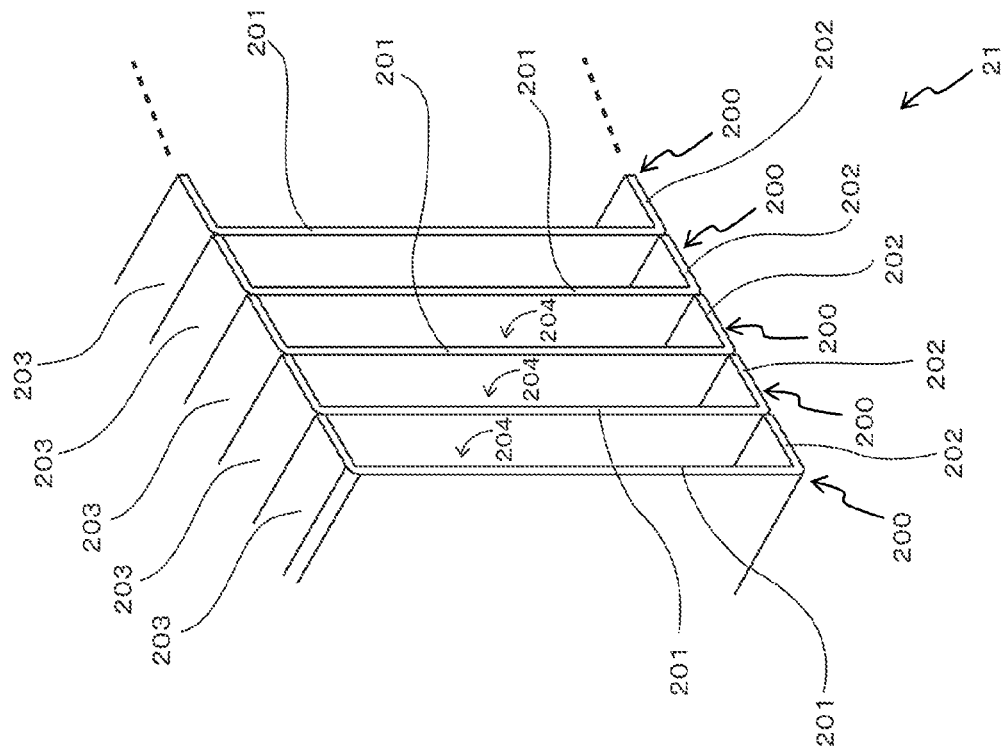
FIG. 6 is an enlarged, perspective view schematically and partially illustrating a configuration of a heatsink of the cooling unit in the notebook PC as an example of the embodiment.
Figure 7:
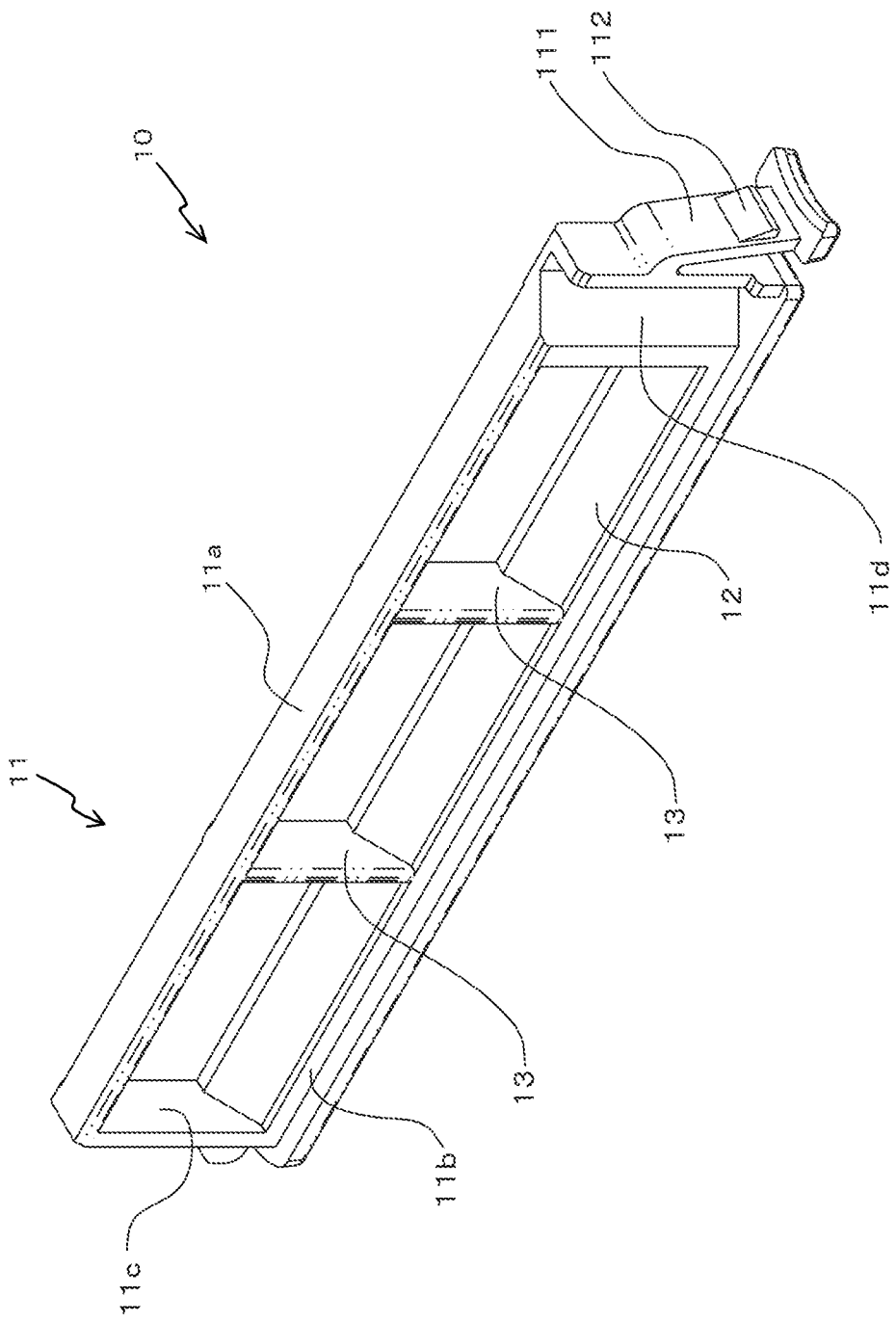
FIG. 7 is a perspective view exemplifying a guide member in the notebook PC as an example of the embodiment.
Figure 8:
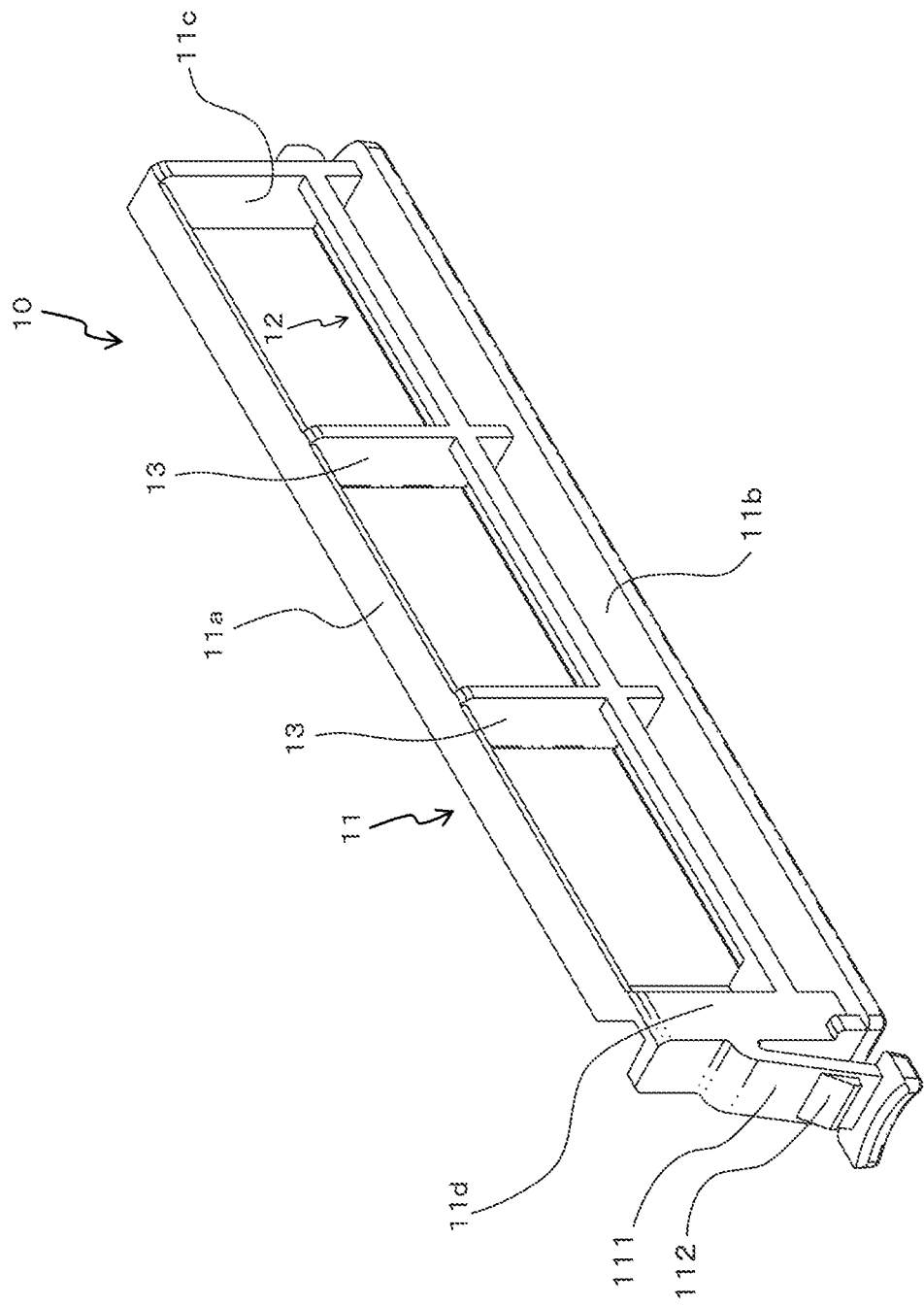
FIG. 8 is a perspective view exemplifying the guide member in the notebook PC as an example of the embodiment.
Figure 9:
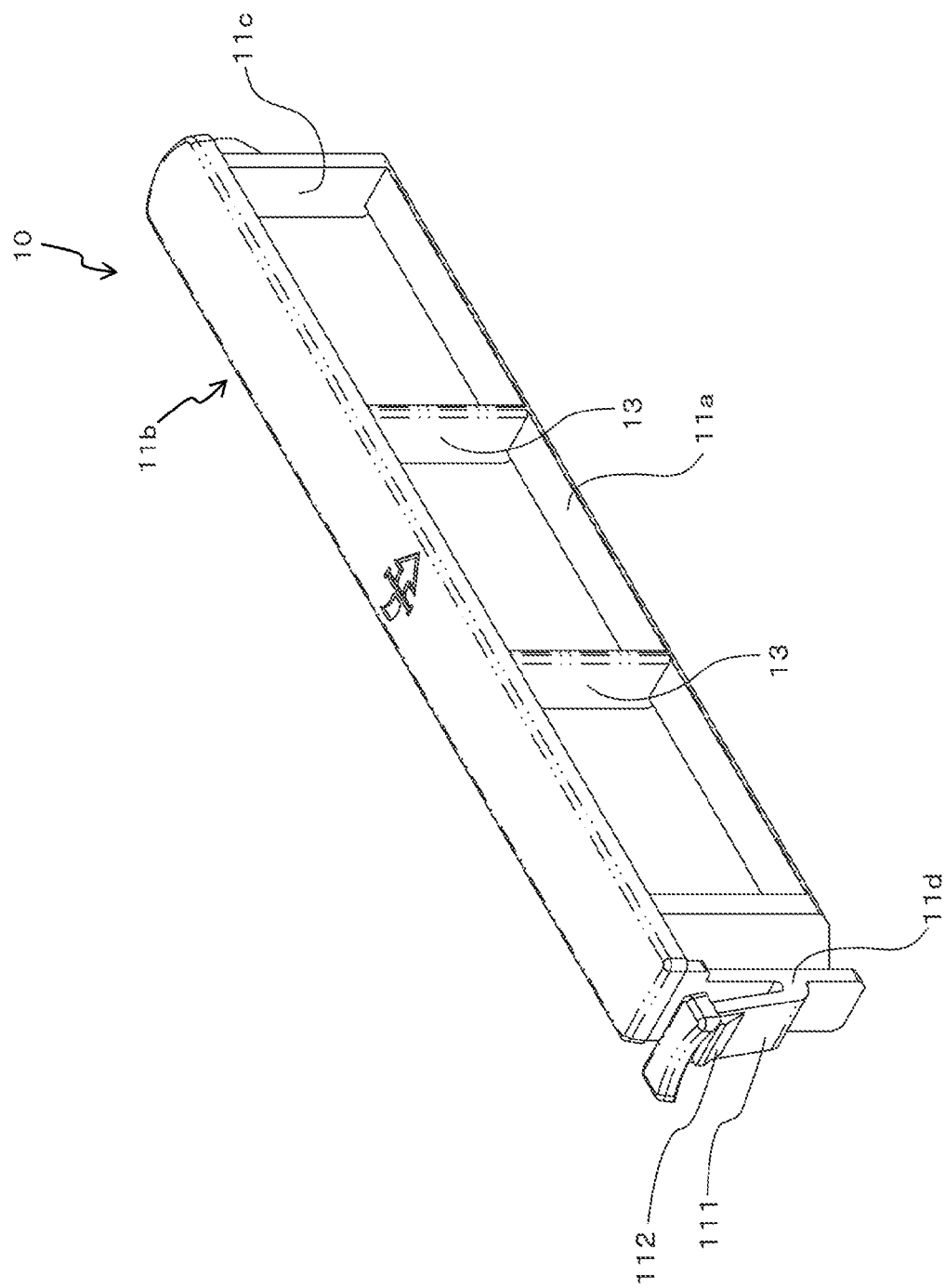
FIG. 9 is a perspective view exemplifying the guide member in the notebook PC as an example of the embodiment.
Figure 10:
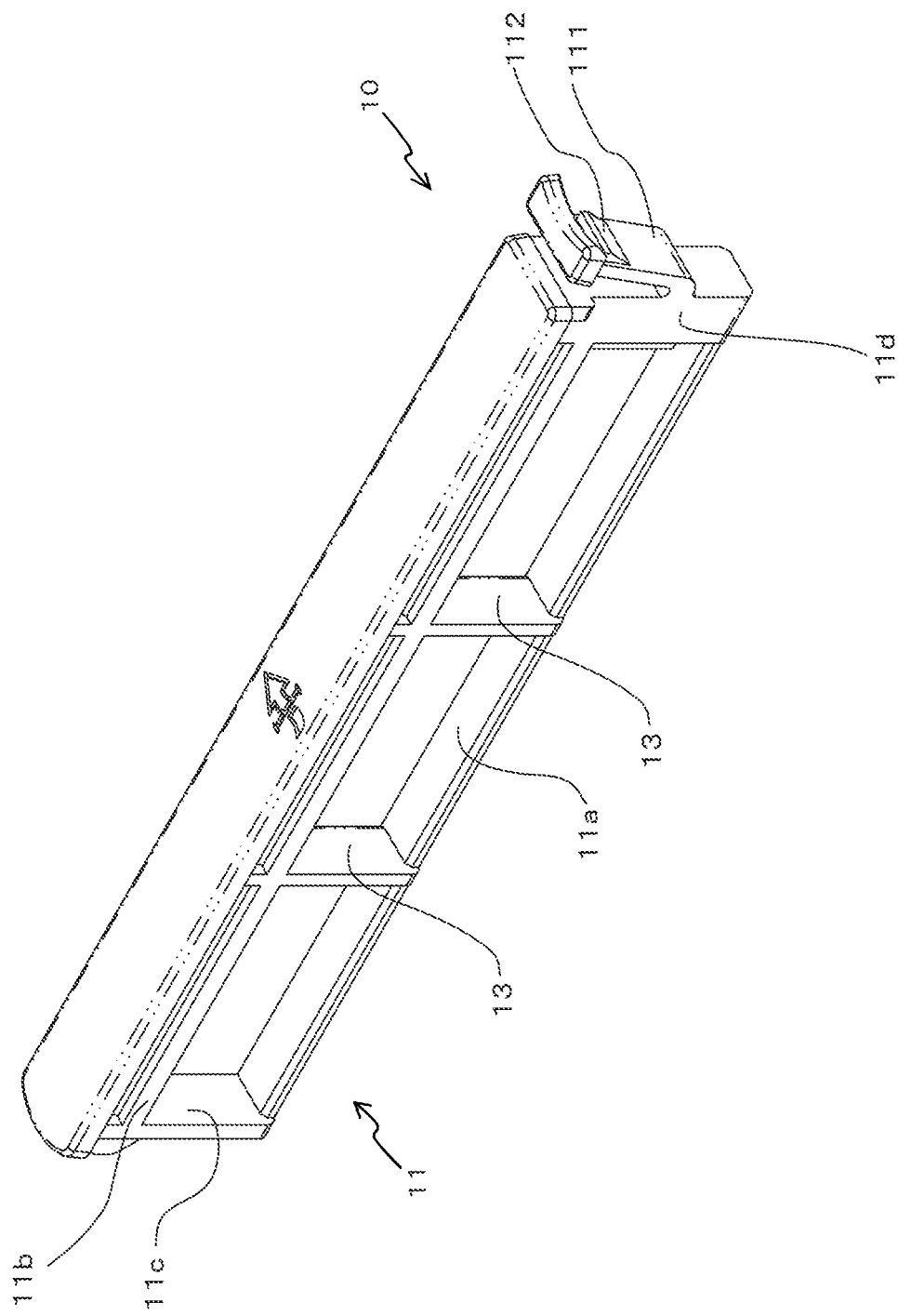
FIG. 10 is a perspective view exemplifying the guide member in the notebook PC as an example of the embodiment.

FIG. 6 is an enlarged, perspective view schematically and partially illustrating a configuration of a heatsink 21 of a cooling unit 100 in the notebook PC 1 as an example of the embodiment.

The notebook PC 1 is an electronic apparatus that contains a heat-generating component (electronic component), such as a central processing unit (CPU) (not illustrated). In addition, the notebook PC 1 is a computing device that performs various computing processes with this CPU.

The notebook PC 1 includes a main-body unit 1001 and a display unit (a second package) 1002, as illustrated in FIG. 1. The display unit 1002 is hinge-coupled to the depth side of the main-body unit 1001 with a hinge mechanism (a coupling portion) 1004, in an openable and closable manner.

The hinge mechanism 1004 axially supports the display unit 1002 so as to open and close the main-body unit 1001, and supports the display unit 1002 with a friction so as to be retained at any given opened angle. It should be noted that various known techniques may be used for the hinge mechanism 1004, and a detailed description thereof will not be given.

The display unit 1002 is equipped with a display screen 1003. The display screen 1003 is attached to a surface of the display unit 1002 which opposes a keyboard 1113 of the main-body unit 1001, when the display unit 1002 closes the main-body unit 1001 with the hinge mechanism 1004. Examples of the display screen 1003 include a liquid crystal display and a plasma display.

The main-body unit 1001 includes a mainboard unit 1101, a PC card slot 1102, a disk drive unit 1103, and the like in a package (a first package) 1007, as illustrated in FIG. 3.

The package 1007 of the main-body unit 1001 is a lower cover that constitutes the lower portion of the main-body unit 1001. The package 1007 includes a substantially rectangular bottom surface portion and side walls erected on the four sides of the bottom surface portion. The package 1007 constitutes a bottom surface of the notebook PC 1 (the main-body unit 1001). The side walls constitute corresponding side surfaces of the notebook PC 1 (the main-body unit 1001).

The mainboard unit 1101, the PC card slot 1102, the disk drive unit 1103, and the like are housed in an inner space surrounded by the above bottom surface portion and side walls, as illustrated in FIG. 4. The bottom surface portion of the package 1007 has a portion provided with an opening, which enables components housed in the inner space of the package 1007 to be replaced without detaching the package 1007 from the main-body unit 1001. Attached to this opening is a detachable cover, such as a cover 1007a that will be described later. The above detachable cover also constitutes part of the bottom surface of the notebook PC 1 (the main-body unit 1001).

The PC card slot 1102 is configured to access a PC card to be inserted into a slot thereof.

The disk drive unit 1103 is configured to be accessed while being removably loaded with a recording medium, such as a CD, a DVD or a Blu-ray (registered trademark) Disc. The disk drive unit 1103 may be a CD drive, a DVD drive, a Blu-ray Disc drive, or the like.

Although not illustrated, a storage unit is disposed below the PC card slot 1102 in FIG. 4. This storage unit is a memory device, such as a hard disk drive (HDD) or a solid state drive (SSD).

Moreover, various other components and circuit devices, such as a memory card slot that is to be accessed while any given type of memory card is inserted into it, may be provided in the package 1007 of the main-body unit 1001.

Disposed on the upper surface of the main-body unit 1001 (the upper portion of a lower cover) is an upper cover 1114, as illustrated in FIG. 2. Disposed on the upper cover 1114 is the keyboard 1113. Furthermore, a power supply button, various indicator lamps, a touch pad, a push button, a fingerprint sensor, and the like may also be arranged on the upper cover 1114.

The mainboard unit 1101 is an electronic circuit board on which the CPU, a chip set, a memory slot, and the like are mounted. Attached to the mainboard unit 1101 is the cooling unit 100 that cools down heat emitted from the heat-generating component, such as the CPU.

The cooling unit 100 is configured to cool down heat emitted from the heat-generating component, such as the CPU. In addition, the cooling unit 100 includes the heat-dissipating member 20, a fan device 30, and a guide member 10, as illustrated in FIG. 3.

The fan device 30 is a device that blows air, and has a casing 31 in which a fan and a motor (both not illustrated) are provided. The fan may be, for example, a multi-blades centrifugal type of fan. In addition, this fan is formed by arranging a plurality of blades in all directions with respect to a rotational shaft, and this rotational shaft is driven and rotated by the motor.

Figure 11:
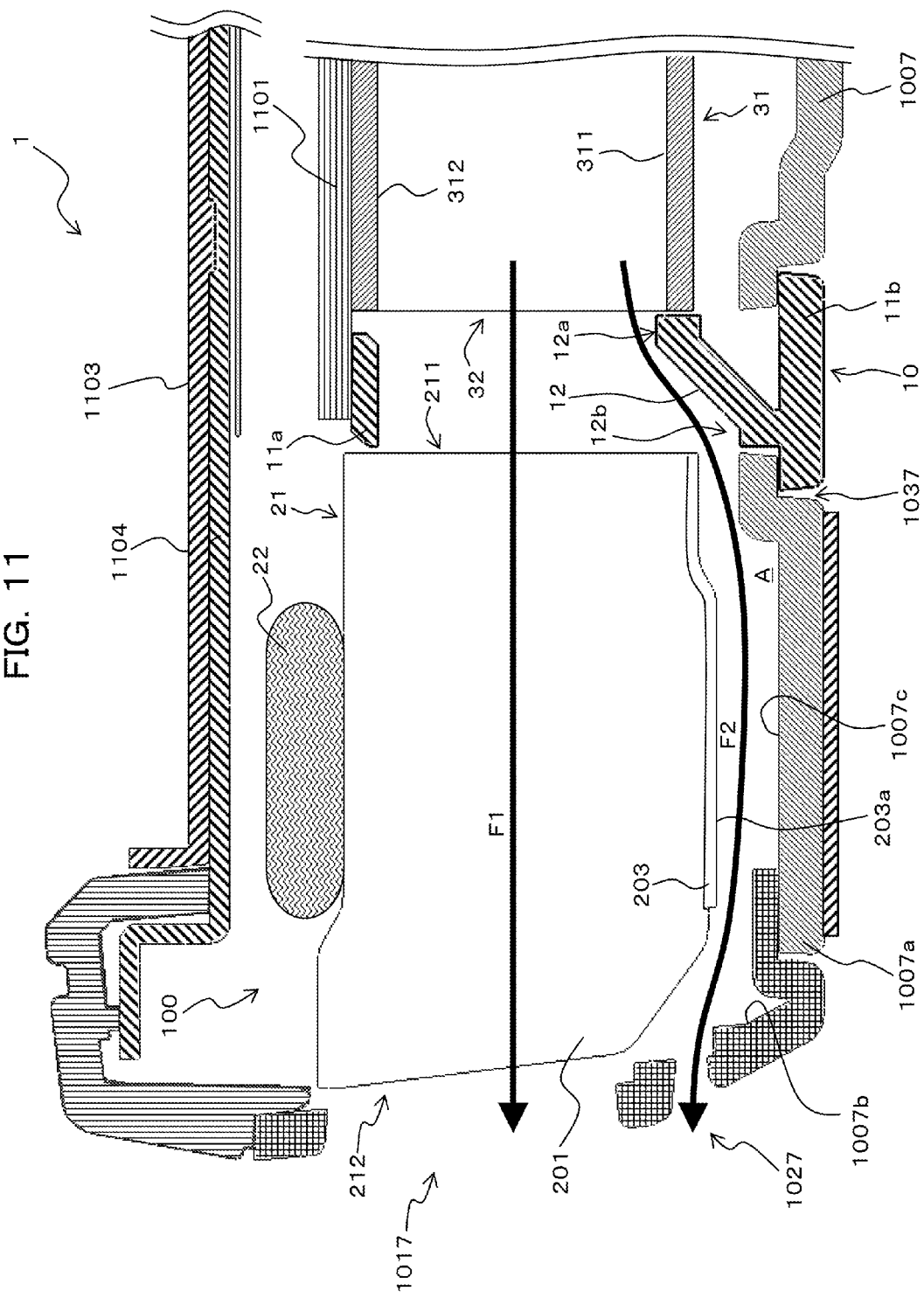
FIG. 11 is a view partially illustrating a side cross-section of a main-body unit in the notebook PC as an example of the embodiment.
Figure 12:
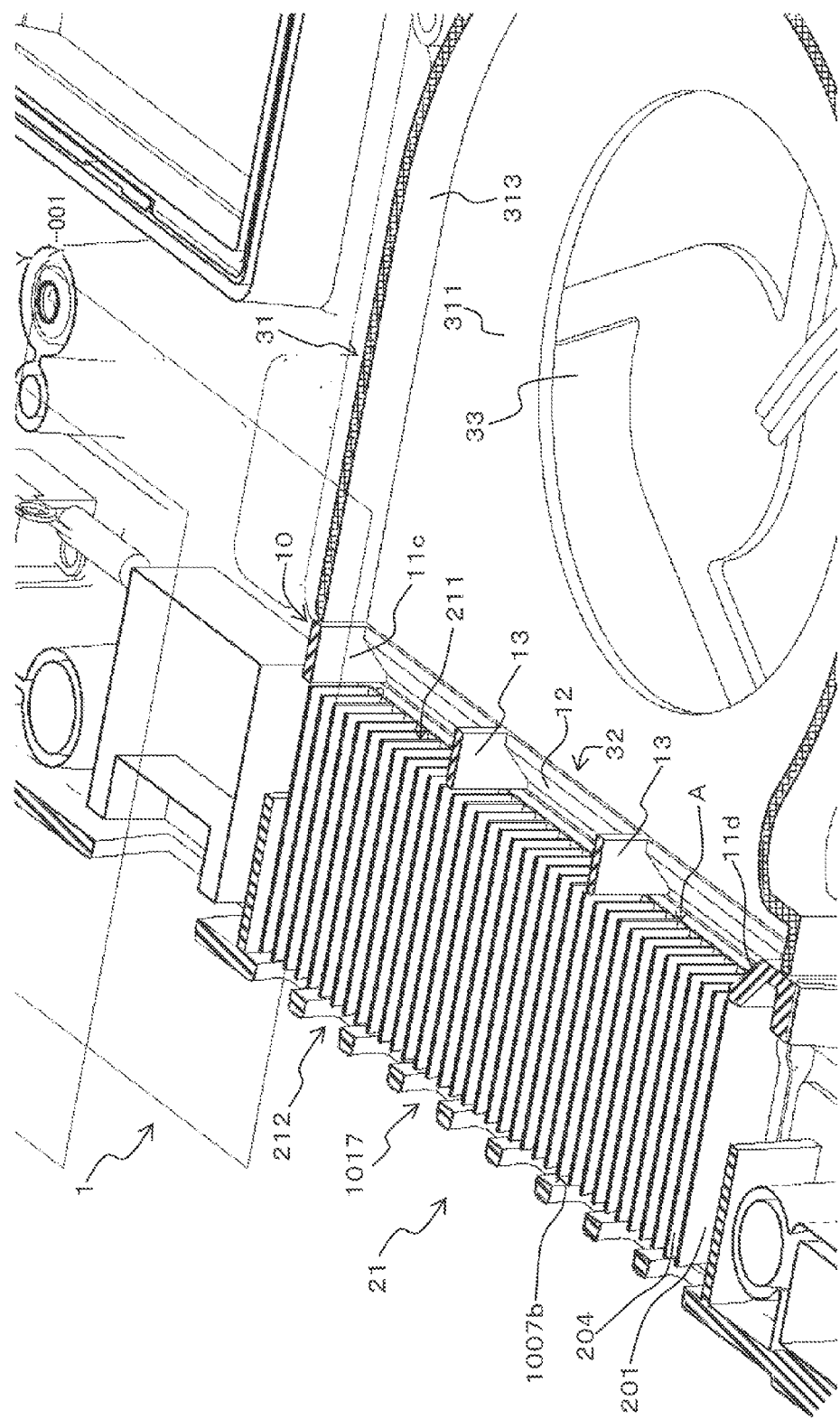
FIG. 12 is a partially broken perspective view exemplifying a state where the notebook PC, as an example of the embodiment, to which the guide member is attached.

The casing 31 includes a first surface 311, a second surface 312 (see FIG. 11), and a side surface 313 (see FIG. 12), as illustrated in FIGS. 3, 11 and 12. The fan is rotatably disposed between the first surface 311 and the second surface 312. For example, the multi-blades centrifugal type of fan may be disposed with its rotational shaft intersecting the first surface 311 and the second surface 312, when the first surface 311 and the second surface 312 oppose each other. In addition, an intake 33 (see FIG. 12) which allows surrounding absorbed air to pass therethrough is formed at least in the first surface 311. It should be noted that the fan device 30 may also include an intake in the second surface 312.

The side surface 313 surrounds the fan while extending along the circumference of the fan, and connects the first surface 311 and the second surface 312. In addition, a rectangle or substantially rectangle outlet 32 (see FIGS. 11 and 12) is formed in the side surface 313.

Once the motor drives and rotates the fan in the fan device 30, air is absorbed into the intake 33 and then discharged from the outlet 32.

In this embodiment, a direction in which the outlet 32 intersects the first surface 311 and the second surface 312 refers to a height direction. This height direction may also be called a thickness or height direction for the main-body unit 1001. In addition, a direction that intersects this height direction and is along the outlet 32 (for example, a depth direction in FIG. 11) refers to a width direction. Furthermore, when the fan device 30 is attached to the main-body unit 1001, as illustrated in FIG. 11, a side of the fan device 30 on which the second surface 312 is located refers to an upper side, whereas a side of the fan device 30 on which the first surface 311 is located refers to a lower side.

The heat-dissipating member 20 is configured to dissipate heat emitted from the heat-generating component. In addition, the heat-dissipating member 20 includes a heat receiving portion 23, a heat pipe 22 and the heatsink 21, as illustrated in FIG. 5.

The heat receiving portion 23 is installed so as to make contact with the heat-generating component (the CPU in this embodiment), and receives the heat emitted from this heat-generating component. The heat receiving portion 23 is a plate-shaped member (a sheet metal for heat reception) composed of a highly heat-conductive material, such as copper or aluminum, and is attached to the heat-generating component, for example, through heat-conductive grease or a heat-conductive sheet.

In this embodiment, the CPU is mounted on the mainboard unit 1101, and the heat receiving portion 23 is attached to the CPU. As a result, the heat is transferred from the CPU to the heat receiving portion 23.

The heat pipe 22 is configured to transfer the heat received by the heat receiving portion 23 to the heatsink 21 by connecting the heat receiving portion 23 to the heatsink 21. Specifically, both ends of the heat pipe 22 are attached to the heat receiving portion 23 and the heatsink 21, respectively. The heat pipe 22 is also composed of a highly heat-conductive material, such as copper or aluminum.

The heatsink 21 is configured to dissipate the heat transferred from the heat pipe 22, and is composed of a highly heat-conductive material, such as copper or aluminum. The heatsink 21 includes a plurality of heat-dissipating fins 201. The plurality of heat-dissipating fins 201 are erected on the heat pipe 22 and arranged parallel to one another at regular intervals, as illustrated in FIG. 5.

Hereinafter, there are cases where spaces in the heatsink 21, each of which is sandwiched by the adjacent heat-dissipating fins 201 and 201, may be called heat-dissipating spaces 204.

Straightening vanes (partition units) 203 cover one side of the corresponding heat-dissipating spaces 204 (the upper sides in the example of FIG. 5). These sides are opposite to sides on which the heat-dissipating fins 201 are attached to the heat pipe 22 (the lower sides in the example of FIG. 5).

In FIG. 5, reference numerals are assigned to only some of the heat-dissipating fins 201, side edges 202, the heat-dissipating spaces 204, and the straightening vanes 203, for the sake of convenience.

In this embodiment, a member 200 including a U-shaped cross-section is formed by bending the opposing pair of side edges 202 and 203 of a rectangular or substantially rectangular metal plate at a right angle in the same direction, as illustrated in FIG. 6. Then, the plurality of members 200 are secured to an end of the heat pipe 22 while being aligned with one another. As a result, the heatsink 21 is formed.

Specifically, as illustrated in FIG. 6, the side edge 202 of each member 200, which is one of the side edges bent in a U-shape, is secured to the upper part of the heat pipe 22, for example, with highly heat-conductive glue. As a result, the side edge 203 of each member 200, which is the other of the side edges bent in the above manner, functions as a straightening vane. In this embodiment, there are cases where the side edges 203 are called the straightening vanes 203. In addition, plate members sandwiched between the corresponding side edges 202 and 203, as described above, function as the heat-dissipating fins 201.

Specifically, in the heatsink 21, one end (upper ends) of the heat-dissipating fins 201, which is opposite to the ends attached to the heat pipe 22, is provided with the straightening vanes 203. The straightening vanes 203 cover gaps between the adjacent heat-dissipating fins 201.

Air blown by the fan device 30, as described above, is introduced into one of openings (on the side of an inlet 211) in each heat-dissipating space 204 of the heatsink 21. Then, the air is sent out from the other of the openings (on the side of an outlet 212) in each heat-dissipating space 204.

Hereinafter, openings of the heatsink 21 which are formed in the corresponding heat-dissipating spaces 204 consecutively arranged adjacent to one another and which are arranged facing the fan device 30 are referred to as the inlets 211 of the heatsink 21. In addition, openings of the heatsink 21 which are formed in the heat-dissipating spaces 204 consecutively arranged adjacent to one another and which are arranged on the opposite side of the corresponding inlets 211 of the heatsink 21 are referred to as the outlets 212 of the heatsink 21.

In the heatsink 21, there are cases where surfaces of the straightening vanes 203, which are opposite to the surfaces facing the corresponding heat-dissipating spaces 204, are called outer surfaces 203a (see FIG. 11). Moreover, the heatsink 21, a direction in which the plurality of heat-dissipating fins 201 are consecutively arranged are referred to as the width direction.

An interval between the side edge 202 and the straightening vane 203 of each heat-dissipating fin 201, namely, a vertical length of each heat-dissipating fin 201 is greater than that of the outlet 32 in the fan device 30. In other words, the inlet 211 of the heatsink 21 has a larger size than that of the outlet 32 of the fan in the height direction.

The inlet 211 in the heatsink 21 has the same or substantially the same width length as the outlet 32 in the fan device 30 does, as described above. In other words, the outlet 32 of the fan device 30 has the same or substantially the same size as the inlet 211 of the heatsink 21 does in the width direction. This configuration enables the heatsink 21 to be cooled down efficiently by air discharged from the outlet 32 of the fan device 30.

In this embodiment, as illustrated in FIGS. 3 and 11, the heat-dissipating member 20 is disposed on the mainboard unit 1101, such that the heat receiving portion 23 is attached to the CPU on the mainboard unit 1101 and the heatsink 21 is located along a side edge of the mainboard unit 1101 so as to protrude from this side edge. In addition, the fan device 30 is disposed adjacent to the heatsink 21, and the outlet 32 of the fan device 30 opposes the inlet 211 of the heatsink 21, as illustrated in FIG.

The mainboard unit 1101 to which the cooling unit 100 is attached is housed in the package 1007 of the main-body unit 1001 while both the first surface 311 of the fan device 30 and the straightening vanes 203 of the heatsink 21 face the inner surface of the bottom surface portion in the package 1007 of the main-body unit 1001, as illustrated in FIG. 4 or 11. As a result, both the first surface 311 of the fan device 30 and the straightening vanes 203 of the heatsink 21 are housed in the package 1007 of the main-body unit 1001 while facing an inner surface 1007c of the cover 1007a. The cover 1007a is detachably attached to an opening of the package 1007 which is provided in order to replace the heat-dissipating member 20 or the fan device 30. It should be noted that this opening and the cover 1007a may be eliminated from the package 1007. In this case, it is preferable that the part of the bottom surface portion of the package 1007 which the cover 1007a would occupy form a surface integrally continuing to another part of the bottom surface portion.

With the above arrangement, as illustrated in FIG. 11, the outer surfaces 203a of the straightening vanes 203 in the heatsink 21 oppose the inner surface 1007c of the cover 1007a, in the main-body unit 1001. Hereinafter, a reference numeral 1007b is assigned to one of the side walls in the package 1007 which opposes the heatsink 21 (see FIG. 11).

The side wall 1007b is configured to have a larger size than that of each heat-dissipating fin 201 in the heatsink 21 along the height direction. With this configuration, as illustrated in FIG. 11, a space A is created between the outer surfaces 203a of the straightening vanes 203 in the heatsink 21 and the inner surface 1007c of the cover 1007a (the bottom surface portion of the package 1007), when the mainboard unit 1101 is housed in the main-body unit 1001.

It can be said that the straightening vanes 203 of the heatsink 21 separate the space A from the heat-dissipating spaces 204. Here, the heat-dissipating spaces 204 are defined inside the heatsink 21, whereas the space A is defined outside the heatsink 21.

A first outlet 1017 is formed in the side wall 1007b of the package 1007 at a location opposing the outlet 212 of the heatsink 21. The first outlet 1017 is an opening including substantially the same size as the outlet 212 of the heatsink 21 does. Of an airflow that has been sent out by the fan device 30, a first airflow that has been discharged from the heatsink 21 is discharged through the first outlet 1017.

A second outlet 1027 is formed below the first outlet 1017, and the second outlet 1027 has substantially the same width size as the outlet 212 of the heatsink 21 does. In addition, the second outlet 1027 is formed in the side wall 1007b of the package 1007 at a location opposing the space A. The airflow which has been sent out by the fan device 30 and then passed through the space A is discharged through the second outlet 1027. In other words, of the airflow that has been sent out by the fan device 30, a second airflow that has traveled on the side of the outer surface 203a of the heatsink 21 is discharged through the second outlet 1027.

FIGS. 7 to 10 are perspective views exemplifying a guide member 10 in the notebook PC 1 as an example of the embodiment, and in the drawings, the different orientations of the guide member 10 are illustrated. FIG. 11 is a view partially illustrating a side cross-section of the main-body unit 1001, and depicts a state where the guide member 10 is installed between the fan device 30 and the heatsink 21.

The guide member 10 is located between the fan device 30 and the heatsink 21, and guides an airflow generated by the fan of the fan device 30 to the outer surface 203a of the heatsink 21. Specifically, the guide member 10 is located downstream of the outlet 32 of the fan device 30 and upstream of the inlet 211 of the heatsink 21.

The guide member 10 includes an outer frame 11, an inclined surface 12, one or more (two in this embodiment) poles 13 and 13, as illustrated in FIGS. 7 to 10. The outer frame 11 includes a rectangular shape formed by joining together four members, or an upper frame 11a, a lower frame 11b, and side frames 11c and 11d, in a frame fashion. The poles 13 and 13 connect the upper frame 11a to the lower frame 11b, thereby reinforcing the outer frame 11. The poles 13 and 13 are arranged at locations where each of the upper frame 11a and the lower frame 11b is equally divided in the longitudinal (width) direction.

The inclined surface 12 is formed in the lower frame 11b along the width direction thereof. The inclined surface 12 couples the lower side of the outlet 32 of the fan device 30 to the cover 1007a of the package 1007 of the main-body unit 1001, when the guide member 10 is installed between the fan device 30 and the heatsink 21, as illustrated in FIG. 11.

Specifically, the inclined surface 12 is formed with one end 12a and another end 12b. Here, the end 12a is located at a front portion of the outlet 32 of the fan device 30, and the end 12b deviates from the inlet of the heatsink 21 in a direction along the outer surface of the heatsink 21.

The inclined surface 12 extends in a direction along widths of the outlet 32 of the fan device 30 and the inlet 211 of the heatsink 21.

As illustrated in FIG. 11, an opening 1037 is formed in the cover 1007a of the package 1007 at a location corresponding to a gap between the fan device 30 and the heatsink 21. The upper frame 11a and the side frames 11c and 11d of the outer frame 11 in the guide member 10 can be inserted into the opening 1037.

The guide member 10 is inserted into the opening 1037 from the side of the upper frame 11a, with the inclined surface 12 facing the heatsink 21. As a result, the guide member 10 is installed between the outlet 32 of the fan device 30 and the inlet 211 of the heatsink 21. Thus, the opening 1037 functions as an opening which enables the guide member 10 to be removed.

The side frame 11d of the guide member 10 is provided with a fixing member 111, as illustrated in FIGS. 7 to 10. The fixing member 111 is an elastic member that protrudes from the outer frame 11d, and is elastically deformed when it is pressed in a direction toward the outer frame 11d. In addition, the fixing member 111 is provided with a protruding portion 112 that protrudes from a side surface thereof on the opposite side of the outer frame 11d.

The guide member 10 configured like the above is inserted into the opening 1037 with the fixing member 111 deformed by being pressed in the direction toward the outer frame 11d. Once the pressing force is released from the fixing member 111 in the state where the insertion of the guide member 10 into the opening 1037 is completed, the fixing member 111 is deformed in a direction away from the outer frame 11d, so that the protruding portion 112 latches onto the inner rim of the opening 1037. In this way, the guide member 10 is fixed to the cover 1007a.

FIG. 12 is a partially broken perspective view exemplifying a state where the notebook PC 1, as an example of the embodiment, to which the guide member 10 is attached. In an example of FIG. 12, the heatsink 21, the guide member 10, and the fan device 30 are laterally cut, and some components, such as the fan and motor of the fan device 30, are not illustrated. In FIG. 12, reference numerals are also assigned to only some of the heat-dissipating fins 201 and the heat-dissipating spaces 204, for the sake of convenience.

When the guide member 10 is attached to the opening 1037, the outlet 32 of the fan device 30 is coupled to both the space A and the inlet 211 of the heatsink 21 through the guide member 10, as illustrated in FIG. 12.

In the notebook PC 1 configured like the above, as an example of the embodiment, once the motor drives the fan of the fan device 30, the fan sends out an airflow to the outlet 32.

When the airflow is output from the outlet 32, it passes through the spaces within the outer frame 11 of the guide member 10, and then enters the inlet 211 of the heatsink 21 (see an arrow F1 in FIG. 11), as illustrated in FIG. 11. After the airflow enters the inlet 211 of the heatsink 21, it passes through the heat-dissipating spaces 204 and then is discharged from the outlet 212. In this case, while passing through the heat-dissipating spaces 204, the airflow draws heat emitted from the heat-dissipating fins 201 of the heatsink 21, thereby cooling down the heatsink 21.

After the airflow is discharged from the outlet 212, it passes through the first outlet 1017 of the package 1007, thereby being exhausted to the exterior of the notebook PC 1.

In addition, as illustrated in FIG. 11, part of the airflow output from the outlet 32 of the fan device 30 is guided by the inclined surface 12 of the guide member 10. Then, the part of the airflow enters the space A between the straightening vanes 203 of the heatsink 21 and the cover 1007a of the package 1007 (see an arrow F2 in FIG. 11).

After the airflow enters the space A, it travels between the straightening vanes 203 of the heatsink 21 and the cover 1007a of the package 1007, and then passes through the second outlet 1027 formed in the side wall 1007b of the package 1007, thereby being exhausted to the exterior of the notebook PC 1.

While passing through the space A, the airflow draws heat emitted from the straightening vanes 203 of the heatsink 21, thereby cooling down the straightening vanes 203 and the air within the space A.

In the notebook PC 1 as an example of the embodiment, as described above, part of an airflow output from the outlet 32 of the fan device 30 is guided by the inclined surface 12 of the guide member 10. Then, the part of the airflow enters the space A between the straightening vanes 203 of the heatsink 21 and the cover 1007a of the package 1007. Finally, the part of the airflow passes through the space A, and is exhausted to the exterior of the notebook PC 1. This configuration prevents air heated due to the heat dissipation of the heatsink 21 from being retained within the space A between the straightening vanes 203 of the heatsink 21 and the cover 1007a of the package 1007. In other words, this configuration avoids the temperature rise of the cover 1007a which is caused by the heat dissipation of the heatsink 21, for example, thus being able to maintain the surface of the cover 1007a at a preset temperature or lower.

Furthermore, the above configuration makes it possible to cool down the air within the space A between the straightening vanes 203 of the heatsink 21 and the cover 1007a of the package 1007 by forcibly discharging the air, even when the interval decreases between the heatsink 21 and the cover 1007a. Therefore, it is possible to provide a structure in which the interval decreases between the heatsink 21 and the cover 1007a, thus reducing the height size of the main-body unit 1001 in the notebook PC 1 and contributing to the slim design for devices. Even by employing this slim design, the arrangement between the fan and other mounted components is not affected at all.

The airflow that passes through the space A and that cools down the heat dissipated by the straightening vanes 203 of the heatsink 21 is a split one of airflow directed from the outlet 32 of the fan device 30. This means that the temperature of the above airflow is not yet increased, because this airflow has not cooled down any other parts before entering the space A. Consequently, the air within the space A is cooled down efficiently by the airflow with a high cooling efficiency, which is directed by the outlet 32 of the fan device 30. In addition, an effect of avoiding the temperature rise of the cover 1007a is also improved.

Moreover, part of the airflow output from the outlet 32 passes through the space within the outer frame 11 of the guide member 10. Then, the part of the airflow enters the inlet 211 of the heatsink 21, and passes through the heat-dissipating spaces 204. Finally, the part of the airflow is exhausted to the exterior of the notebook PC 1 through the outlet 212 and the first outlet 1017. Through this processing, the function as the cooling unit 100 is fulfilled, in which the airflow cools down the heatsink 21 by drawing heat dissipated by the heat-dissipating fins 201 of the heatsink 21.

With the presence of the inclined surface 12 below the front portion of the outlet 32 of the fan device 30, air discharged from the outlet 32 is prevented from being retained at this location. This configuration enables the air discharged from the outlet 32 of the fan device 30 to be utilized to cool down the heatsink 21 and the space A efficiently.

The present invention is not limited to the above embodiment, and various modifications thereof can be made and carried out without departing from the spirit of the present invention.

In the above embodiment, as one example, the guide member 10 is provided with the inclined surface 12, and the inclined surface 12 guides an airflow generated by the fan of the fan device 30 to the outer surface of the heatsink 21. However, the present invention is not limited to this example.

Figure 13:
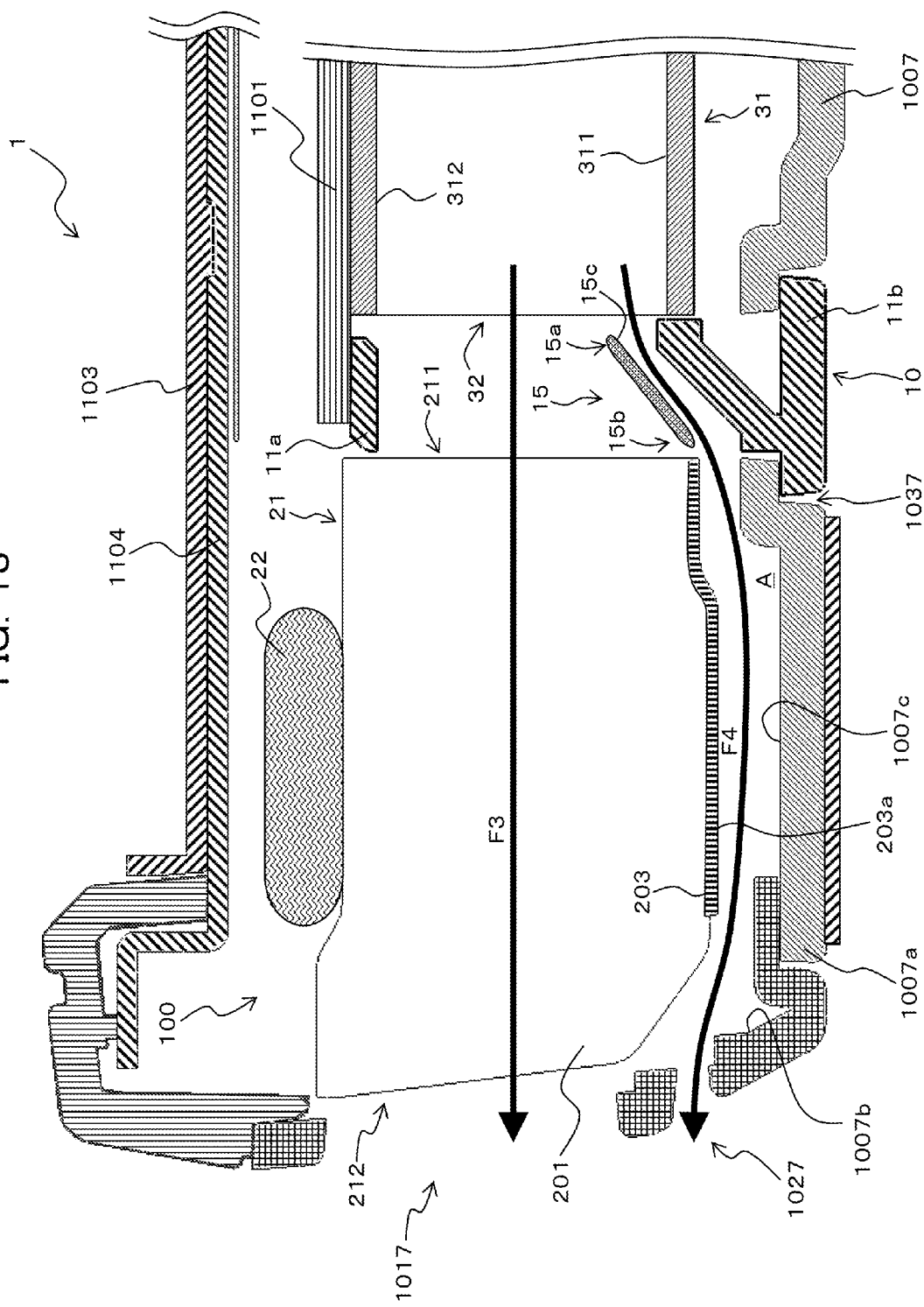
FIG. 13 is a view illustrating a modification of the guide member in the notebook PC as an example of the embodiment.

FIG. 13 is a view illustrating a modification of the guide member 10 in the notebook PC 1 as an example of the embodiment, and is a view partially illustrating a side cross-section of the main-body unit 1001. In FIG. 13, the guide member 10 is installed between the fan device 30 and the heatsink 21.

The guide member 10 of the FIG. 13 includes a splitting plate 15 and a blocking projection 14, in place of the inclined surface 12 in the guide member 10 of FIG. 11. Other parts of the guide member 10 of the FIG. 13 include the same configuration as the guide member 10, as described above, according to the above embodiment. In addition, except for the guide member 10, the parts of notebook PC 1 include the same configuration as those of the notebook PC 1, as described above, according to the above embodiment.

It should be noted that a description of parts that are the same as those described above will be omitted, for the sake of convenience. In the drawing, the same reference numerals as those having been described above denote the same or substantially the same parts, and therefore a description thereof will also be omitted.

The splitting plate 15 is a plate-shaped member that branches (or splits) an airflow generated by the fan of the fan device 30, and guides the branched part of the airflow to the outer surface 203a of the heatsink 21.

As illustrated in FIG. 13, when the guide member 10 is installed between the fan device 30 and the heatsink 21, an end portion 15a of the splitting plate 15 is disposed midway between the upper portion (second surface 312) and the lower portion (first surface 311) in the outlet 32 of the fan device 30 in the height direction. In addition, an end portion 15b of the splitting plate 15, which is on the opposite side of the end portion 15a, is located opposite the lower end of the inlet 211 of the heatsink 21 (the lower ends of the straightening vanes 203 on the side of the inlet 211), as illustrated in FIG. 13.

Specifically, a lower side surface 15c of the splitting plate 15 is an inclined surface formed with one end and another end. Here, the one end is located midway across the outlet 32 of the fan device 30 in the height direction, and the other end is located opposite an end portion of the inlet 211 of the heatsink 21 which is on the side of the outer surface 203a. In addition, the lower side surface 15c of the splitting plate 15 opposes the outlet 32 of the fan device 30.

The splitting plate 15 connects the side frames 11c and 11d of the outer frame 11 in the guide member 10. In other words, the splitting plate 15 extends in a direction along both widths of the outlet 32 of the fan device 30 and the inlet 211 of the heatsink 21.

The blocking projection 14 is configured to protrude from the lower frame 11b toward the upper frame 11a, so as to extend to a height location of the lower side (first surface 311) of the outlet 32 in the fan device 30. In addition, the blocking projection 14 is configured to extend along a width of the lower side of the outlet 32.

When the guide member 10 is installed between the fan device 30 and the heatsink 21, the blocking projection 14 couples the lower side of the outlet 32 in the fan device 30 to the cover 1007a of the package 1007 in the main-body unit 1001, as illustrated in FIG. 13. Because of this configuration, the blocking projection 14 blocks air discharged from the outlet 32 of the fan device 30 from entering a gap between the cover 1007a and the lower side of the first surface 311 in the fan device 30. Specifically, with the blocking projection 14, the airflow discharged from the fan device 30 is utilized to cool down the heatsink 21 and the space A efficiently, so that the cooling efficiency is improved.

In the notebook PC 1 configured above, as an example of the modification of the embodiment, once the motor drives the fan of the fan device 30, an airflow is sent out from the fan to the outlet 32.

As illustrated in FIG. 13, once the airflow is output from the outlet 32, it passes through the spaces within the outer frame 11 of the guide member 10, and then enters the inlet 211 of the heatsink 21 (see an arrow F3 in FIG. 13). After the airflow enters the inlet 211 of the heatsink 21, it passes through the heat-dissipating spaces 204 and then is discharged from the outlet 212. While passing through the heat-dissipating spaces 204, this airflow draws heat dissipated by the heat-dissipating fins 201 of the heatsink 21, thereby cooling down the heatsink 21.

After the airflow is discharged from the outlet 212, it passes through the first outlet 1017 of the package 1007, thereby being exhausted to the exterior of the notebook PC 1. As illustrated in FIG. 13, part of the airflow output from the outlet 32 of the fan device 30 hits against the lower side surface 15c of the splitting plate 15 in the guide member 10. Then, this airflow travels (or is guided) downward along the lower side surface 15c, and enters the space A between the straightening vanes 203 of the heatsink 21 and the cover 1007a of the package 1007 (see an arrow F4 in FIG. 13).

After the airflow enters the space A, it travels between the straightening vanes 203 of the heatsink 21 and the cover 1007a of the package 1007. Then, this airflow passes through the second outlet 1027 of the package 1007, thereby being exhausted to the exterior of the notebook PC 1.

In this case, while passing through the space A, the airflow draws heat dissipated by the straightening vanes 203 of the heatsink 21, thereby cooling down the straightening vanes 203 and the air within the space A.

As described above, the modification of the notebook PC 1 as an example of the embodiment also makes it possible to produce the same advantageous effect as the above embodiment does.

The guide member 10, as described above, may be equipped with a function of collecting debris. In more detail, the guide member 10 places and extends filters in areas surrounded by the outer frame 11, the poles 13 and the inclined surface 12. For example, each of these filters may be formed in mesh form.

Using the above filters makes it possible to remove dust, debris or the like which has been absorbed into the notebook PC 1 by the fan device 30 and sent out from the outlet 32. Thus, with the filters, dust, debris or the like is efficiently blocked from entering the inlet 211 of the heatsink 21 and the heat-dissipating spaces 204, so that the reduction in the heat dissipation efficiency is avoided.

The dust, debris or the like adhered on the filters can be easily removed, because the guide member 10 is configured so as to be detached from the main-body unit 1001.

In the embodiment and modification as described above, the guide member 10 is detachably configured between the fan device 30 and the heatsink 21. However, the present invention is not limited to this configuration. Alternatively, the guide member 10 may be configured so as to be fixed between the fan device 30 and the heatsink 21, for example, as part of the package 1007. In this case, one or some of the poles 13, the upper frame 11a, the lower frame 11b and the side frames 11c and 11d in the guide member 10 may be partially omitted as appropriate.

A mechanism for fixing the guide member 10 to the opening is not limited to the fixing member 111 and the protruding portion 112, and various modifications, such as fixing using screws, may be made and carried out.

Furthermore, in the embodiment as described above, the example has been described, in which the fan device 30 is implemented using a multi-blades centrifugal type of fan, but the present invention is not limited to this configuration. Alternatively, any other type of fan may be used, in addition to a multi-blades centrifugal type.

Moreover, in the embodiment and modification as described above, the example has been described, in which an electronic component to be cooled down is a CPU, but the present invention is not limited to this configuration. Any other electronic component may be cooled down, in addition to a CPU.

It is believed that the embodiment and modification of the present invention, as described above, can be carried out and manufactured by a person skilled in the art, as long as they are disclosed herein.

With the technique disclosed herein, even the outer surface of the heatsink can be cooled down, so that cooling can be performed efficiently.

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling unit mounted in a package of an electronic apparatus comprising:
   a fan provided with an outlet;
   a heatsink, including a plurality of heat-dissipating fins standing parallel to one another and straightening vanes covering gaps between each adjacent pair of the heat-dissipating fins at one end of each of the heat-dissipating fins, the heatsink being provided with an inlet having a larger size than that of the outlet of the fan in a height direction, an airflow generated by the fan passing through an interior of a first space surrounded by each adjacent pair of the heat-dissipating fins and one surface of each of the straightening vanes; and
   a guide member disposed between the fan and the heatsink, the guide member guiding the airflow to a second space surrounded by another surface of each of the straightening vanes and the package.

2. The cooling unit according to claim 1, wherein the guide member is removably disposed between the fan and the heatsink.

3. The cooling unit according to claim 1, wherein the guide member includes an inclined surface formed with one end and another end, the one end located at a front portion of the outlet of the fan in the height direction, the other end deviating from the inlet of the heatsink in the height direction.

4. The cooling unit according to claim 1, wherein
the guide member includes an inclined surface opposing the outlet of the fan, and
the guide member is formed with one end and another end, the one end located midway across the outlet of the fan in the height direction, the other end located opposite to inlet-side end of the straightening vanes.

5. The cooling unit according to claim 3, wherein
the outlet of the fan and the inlet of the heatsink have substantially the same size in a width direction intersecting the height direction, and
the inclined surface extends across the width direction.

6. An electronic apparatus comprising:
a cooling unit including:
a fan provided with an outlet;
a package housing the cooling unit;
a heatsink, including a plurality of heat-dissipating fins standing parallel to one another and straightening vanes covering gaps between each adjacent pair of the heat-dissipating fins at one end of each of the heat-dissipating fins, the heatsink being provided with an inlet having a larger size than that of the outlet of the fan in a height direction, an airflow generated by the fan passing through an interior of a first space surrounded by each adjacent pair of the heat-dissipating fins and one surface of each of the straightening vanes;
a guide member disposed between the fan and the heatsink, the guide member guiding the airflow to a second space surrounded by another surface of each of the straightening vanes and the package; and
an electronic component disposed in the package, the electronic component cooled by the cooling unit.

7. The electronic apparatus according to claim 6, wherein the package has an inner surface opposing the second space.

8. The electronic apparatus according to claim 7, wherein the heatsink has an outlet through which the airflow is discharged,
the package has a first surface and a second surface, the first surface having the inner surface, the second surface connected to the first surface, and
the second surface has a first outlet through which a first airflow, which is part of the airflow which has been discharged from the outlet of the heatsink, is discharged, and a second outlet through which a second airflow, which is part of the airflow which has traveled in the second space, is discharged.

9. The electronic apparatus according to claim 8, wherein the first surface has an opening that enables the guide member to be removed.

10. The electronic apparatus according to claim 8, wherein the first surface is a bottom surface of the electronic apparatus, and
the second surface is a side surface of the electronic apparatus.

11. The electronic apparatus according to claim 6, wherein the package is a first package having an upper surface on which a keyboard is mounted, and the electronic apparatus further comprising:
a second package; and
a coupling portion coupling the first package and the second package in an openable and closable manner.

12. The electronic apparatus according to claim 11, wherein
a display screen is provided on a surface of the second package which opposes the keyboard, in a closed state.

13. A guide member provided in a cooling unit mounted in a package of an electronic apparatus, the cooling unit including: a fan provided with an outlet; and a heatsink, including a plurality of heat-dissipating fins standing parallel to one another and straightening vanes covering gaps between each adjacent pair of the heat-dissipating fins at one end of each of the heat-dissipating fins, the heatsink being provided with an inlet having a larger size than that of the outlet of the fan in a height direction, an airflow generated by the fan passing through an interior of a first space surrounded by each adjacent pair of the heat-dissipating fins and one surface of each of the straightening vanes, the guide member guiding the airflow between the fan and the heatsink, the guide member comprising:
an inclined surface formed with one end and another end, the one end located at a front portion of the outlet of the fan in the height direction, the other end deviating from the inlet of the height direction,
wherein the guide member is disposed between the fan and the heatsink, and guides the airflow to a second space surrounded by another surface of each of the straightening vanes and the package.

14. A guide member provided in a cooling unit mounted in a package of an electronic apparatus, the cooling unit including: a fan provided with an outlet; and a heatsink, including a plurality of heat-dissipating fins standing parallel to one another and straightening vanes covering gaps between each adjacent pair of the heat-dissipating fins at one end of each of the heat-dissipating fins, the heatsink being provided with an inlet having a larger size than that of the outlet of the fan in a height direction, an airflow generated by the fan passing through an interior of a first space surrounded by each adjacent pair of the heat-dissipating fins and one surface of each of the straightening vanes, the guide member guiding the airflow between the fan and the heatsink, the guide member comprising:
an inclined surface opposing the outlet of the fan, the inclined surface formed with one end and another end, the one end located midway across the outlet of the fan in the height direction, the other end located opposite to inlet-side end of the straightening vanes,
wherein the guide member is disposed between the fan and the heatsink, and guides the airflow to a second space surrounded by another surface of each of the straightening vanes and the package.

15. The guide member according to claim 13, wherein the outlet of the fan and the inlet of the heatsink have substantially the same size in a width direction intersecting the height direction, and
the inclined surface extends across the width direction.

16. The guide member according to claim 13, wherein the guide member is removably disposed between the fan and the heatsink.

* * * * *